(12) United States Patent
Wajima et al.

(10) Patent No.: US 6,274,968 B1
(45) Date of Patent: Aug. 14, 2001

(54) ELECTRONIC COMPONENT (75) Inventors: Masaya Wajima, Shinminato; Ryuhei Yoshida, Toyama, both of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/173,603

(22) Filed: Oct. 16, 1998

(30) Foreign Application Priority Data

Nov. 18, 1997 (JP) .................................... 9-317096

(51) Int. Cl.[7] .................................................. H01L 41/08
(52) U.S. Cl. .......................................... 310/348; 310/344
(58) Field of Search .................................. 310/320, 344, 310/348

(56) References Cited

U.S. PATENT DOCUMENTS

| | | | |
|---|---|---|---|
| 3,073,975 | * | 1/1963 | Bigler et al. .................... 310/344 |
| 3,359,435 | * | 12/1967 | Webb .............................. 310/344 X |
| 3,453,458 | * | 7/1969 | Curran et al. .................... 310/344 |
| 5,198,716 | * | 3/1993 | Godshall et al. ............... 310/344 X |
| 5,430,345 | * | 7/1995 | Takahashi ....................... 310/344 X |
| 5,532,542 | * | 7/1996 | Yoshida et al. ..................... 310/348 |
| 5,801,474 | * | 9/1998 | Sakairi ............................. 310/344 X |
| 5,821,665 | * | 10/1998 | Onishi et al. ................... 310/344 X |
| 6,046,529 | * | 4/2000 | Yoshida et al. ..................... 310/348 |
| 6,163,101 | * | 12/2000 | Yoshida et al. ..................... 310/348 |

FOREIGN PATENT DOCUMENTS 0 794 616    9/1997  (EP) .

* cited by examiner

*Primary Examiner*—Mark O. Budd
(74) *Attorney, Agent, or Firm*—Keating & Bennett, LLP

(57) ABSTRACT

An electronic component includes an electronic component element having a substantially rectangular plate disposed between upper and lower case substrates in the form of substantially rectangular plates such that the upper and lower case substrates and the electronic component element are stacked and define an integral unit. Assuming that the length of the shorter sides and the length of the longer sides of the electronic component element are $a_0$ and $b_0$, respectively, and that the length of the shorter sides and the length of the longer sides of the lower case substrate 3 are $a_1$ and $b_1$, respectively, the relationships $a_0 < a_1$ and $b_0 < b_1$ are satisfied.

19 Claims, 10 Drawing Sheets

ELECTRONIC COMPONENT

BACKGROUND OF THE INVENTION

1. Field of the Invention

The present invention relates to an electronic component such as a piezoelectric resonator and, more specifically, to an improved surface mounting type electronic component in which an electronic component element is disposed between upper and lower case substrates.

2. Description of the Related Art

In a piezoelectric resonance device, such as a piezoelectric resonance element, a piezoelectric resonance element is packaged and sealed in such a way that oscillation thereof is not hindered in order to allow the piezoelectric resonance element to be surface-mounted on a printed circuit board or the like and to improve the environmental compatibility of the resonance element.

Figure 11:
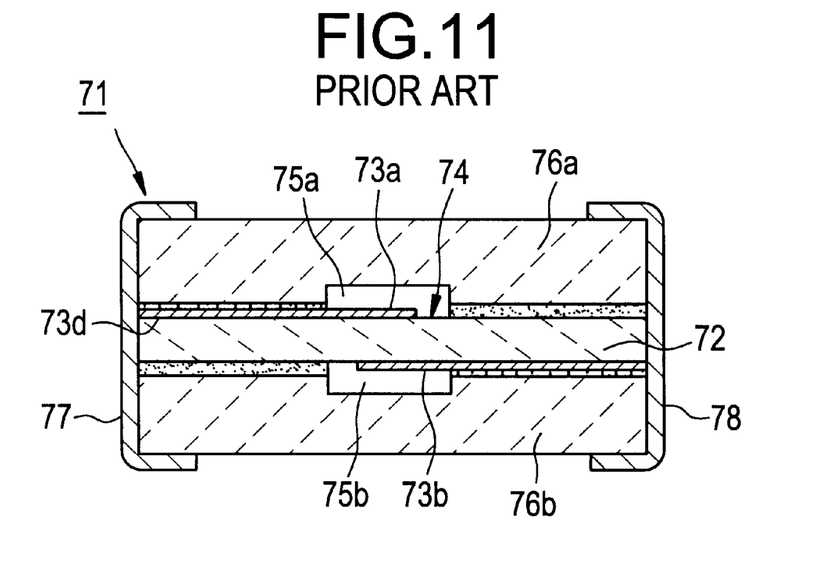
FIG. 11 is a sectional view showing an example of a conventional piezoelectric resonance device.
Figure 12:
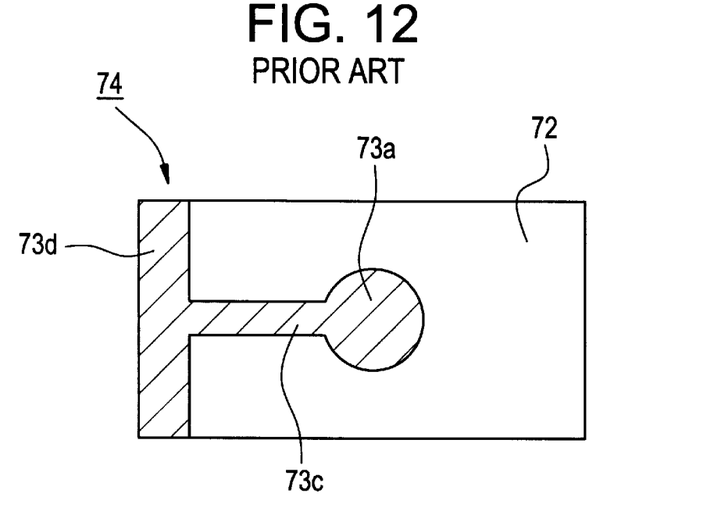
FIG. 12 is a plan view of the piezoelectric resonance element used in the piezoelectric resonance device shown in FIG. 11.

For example, Japanese Patent Laid-Open No. 4-70107 (Japanese Patent Application No. 2-183124) discloses a piezoelectric resonance device having a construction as shown in FIG. 11. In a piezoelectric resonance device 71, a piezoelectric resonance element 74 is formed by disposing resonance electrodes 73a and 73b on the major surfaces of a piezoelectric substrate 72 which has a rectangular plate shape. As shown in FIG. 12, in the piezoelectric resonance element 74, the resonance electrode 73a is provided at the center of one of the major surfaces of the piezoelectric substrate 72 and connected to a lead electrode 73d through a conductive connection portion 73c. Spaces 75a and 75b for allowing free and unhindered vibration are provided on the upper and lower sides of the piezoelectric resonance element 74. An upper case substrate 76a and a lower case substrate 76b which comprise rectangular plates having the same size as the piezoelectric substrate 72 are stacked together. External electrodes 77 and 78 are provided on an exterior of the piezoelectric resonance device 71.

Figure 13:
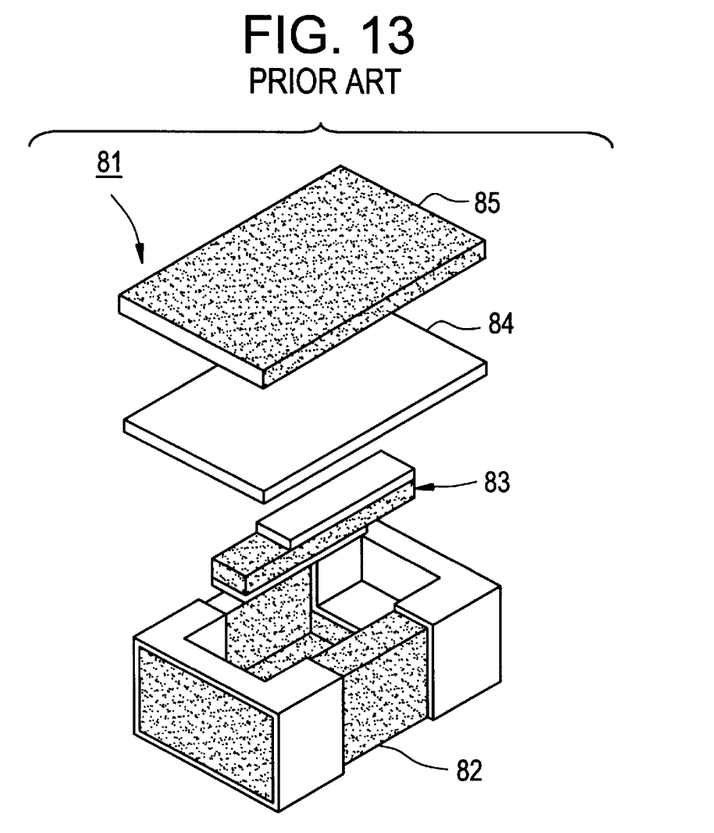
FIG. 13 is an exploded perspective view illustrating another example of a conventional piezoelectric resonance device.

Further, Japanese Utility Model Laid-Open No. 5-25818 (Japanese Utility Model Application No. 3-81444) discloses a piezoelectric resonance device as shown in FIG. 13. In this piezoelectric resonance device 81, a piezoelectric resonance element 83 is disposed in a case 82 having an upper opening. The upper opening of the case 82 is closed by joining a cover member 85 thereto via adhesive 84.

Figure 14:
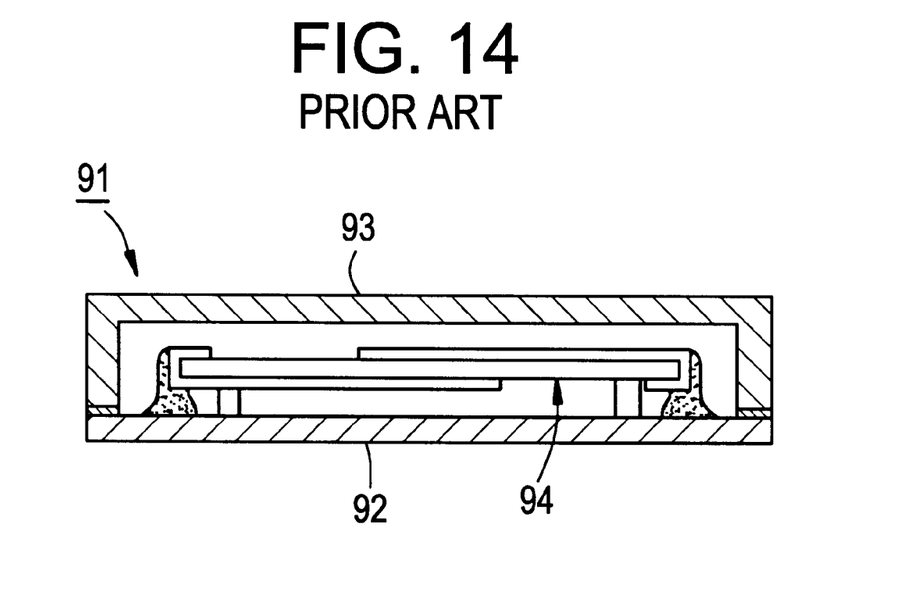
FIG. 14 is a sectional view showing still another example of a conventional piezoelectric resonance device.

Further, Japanese Utility Model Laid-Open No. 4-69921 (Japanese Utility Model Application No. 2-113616) discloses a piezoelectric oscillation component as shown in FIG. 14. In this piezoelectric oscillation component 91, a case includes a case substrate 92 in the form of a rectangular plate and a rectangular-prism-shaped case member 93 having a lower opening and joined to the upper portion of the case substrate 92. A piezoelectric resonance element 94 is mounted on the case substrate 92.

Figure 15:
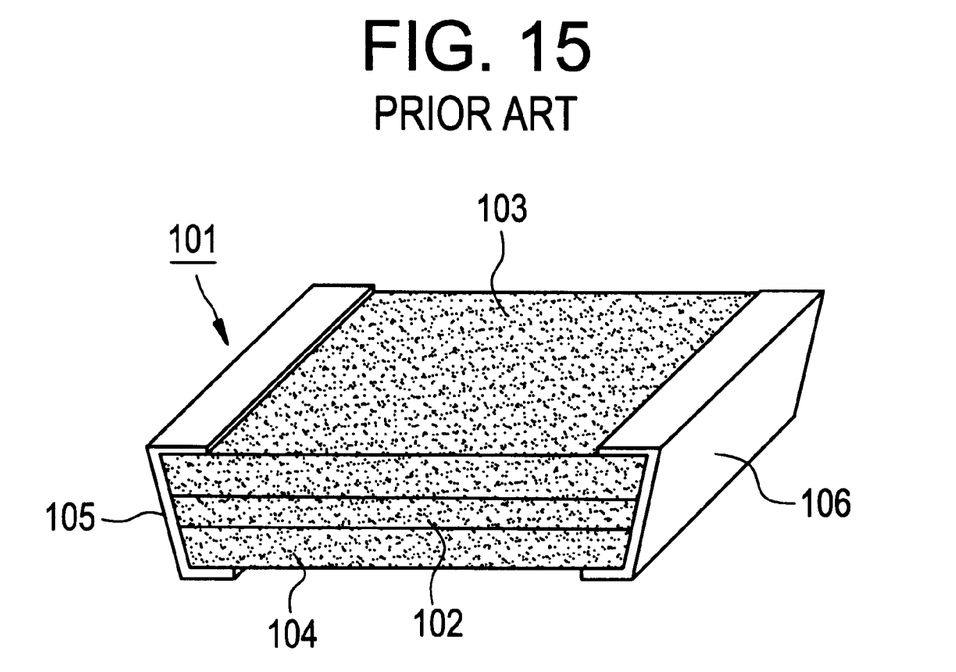
FIG. 15 is a perspective view of a further example of a conventional piezoelectric resonance device.

Further, Japanese Utility Model Laid-Open No. 6-5215 (Japanese Utility Model Application No. 4-49012) discloses a chip-type piezoelectric oscillator 101 as shown in FIG. 15. In the chip-type piezoelectric oscillator 101, a piezoelectric element 102 in the form of a rectangular plate is sandwiched between case substrates 103 and 104 which are composed of rectangular plates. The side surfaces of the piezoelectric oscillator 101 are inclined in order to prevent external electrodes 105 and 106 from being separated when the piezoelectric oscillator 101 is mounted on a printed circuit board.

In the piezoelectric resonance device 71 shown in FIG. 11, the piezoelectric resonance element 74 and the upper and lower case substrates 76a and 76b have the same size. Thus, when assembling the device, the alignment of the piezoelectric resonance element 74 with the upper and lower case substrates 76a and 76b is rather difficult to perform. When the piezoelectric resonance element 74 and the upper and lower case substrates 76a and 76b are assembled such that there is a deviation in alignment between any of the element 74 and substrates 76a, 76b, cracks, chips, and other problems are generated in the piezoelectric resonance element 74 when it is handled.

In the piezoelectric resonance device 81 shown in FIG. 13, the piezoelectric resonance element 83 is disposed in a case, so that cracks, chips, and other problems are not easily generated in the piezoelectric resonance element as in the above described case. However, since the piezoelectric resonance element 83 is disposed in a case which is larger than the resonance element 83, it is extremely difficult to meet the demand for a reduction in size of the component.

Similarly, in the piezoelectric resonance device 91 shown in FIG. 14 also, it is rather difficult to meet the demand for a reduction in size due to the construction in which the piezoelectric resonance element 94 is arranged in the case formed by the lower case substrate 92 and the case member 93.

The piezoelectric oscillator 101 shown in FIG. 15 has the same problem as the piezoelectric resonance device shown in FIG. 12 although the sizes of the piezoelectric element 102 and the upper and lower cases 103 and 104 are different. That is, in the piezoelectric oscillator 101, the joining areas are the same in the joint section where the piezoelectric element 102 is joined to the lower case substrate 103. Further, in the joint section where the piezoelectric element 102 is joined to the upper case substrate 104, the areas of the portions corresponding to the joint interface are the same. Thus, the alignment of these portions is extremely difficult to perform. When the alignment is not performed in a satisfactory manner, cracks, chips, and other problems are liable to be generated in the piezoelectric element 102 when the oscillator is handled.

The above problems are experienced not only in surface mounting type electronic components using piezoelectric elements but also in surface mounting type electronic components using other electronic component elements.

SUMMARY OF THE INVENTION

To overcome the problems described above, preferred embodiments of the present invention provide an electronic component in which surface mounting is possible by using a case member wherein the positioning of the electronic component element with respect to the case member is easy to perform such that cracks, chips, and other problems are not generated in the electronic component element when there is some positionally deviation between the electronic component and the case member, and wherein it is possible to achieve a significant reduction in size of the electronic component.

One preferred embodiment of the present invention provides an electronic component, including an electronic component element, upper and lower case substrates stacked on each other with the electronic component element disposed therebetween, the electronic component, the upper case and the lower case including substantially rectangular members, wherein relationships $a_0 < a_1$ and $b_0 < b_1$ are satisfied where a length of shorter sides and a length of longer sides of the electronic component element are $a_0$ and $b_0$, respectively, and a length of shorter sides and a length of longer sides of the lower case substrate are $a_1$ and $b_1$, respectively.

According to the electronic component described above, the length of the shorter sides and the length of the longer sides of the electronic component element are respectively smaller than the length of the shorter sides and the length of the longer sides of the lower case substrate, so that, when securing the electronic component element to the lower case substrate, the positioning is easily effected and reliably achieved. That is, since the electronic component element is smaller than the lower case substrate, cracks, chips, and other problems are not generated even if there is some positionally deviation in the electronic component element, as long as the electronic component element does not protrude sideways from the outer peripheral edge of the lower case substrate.

Thus, in an electronic component including an electronic component element disposed between upper and lower case substrates, it is possible to simplify the assembly structure and process and effectively prevent breakage of and damage to the electronic component. Further, since a structure in which the electronic component element is accommodated in a case is not used, the electronic component has a significantly reduced size.

In the above described electronic component, a plurality of electrodes are preferably provided on the lower case substrate, the electronic component element being electrically connected to the electrodes of the lower case substrate via a conductive joint material.

Thus, the electronic component of preferred embodiments of the present invention can be easily surface-mounted on a printed circuit board or the like from the lower case substrate side.

In addition, by arranging the external electrodes so as to extend to the lower case substrate, the connection between the conductive joint material and the external electrodes on the lower case substrate and the electrical connection between the conductive joint material and the electrodes of the electronic component element can be effected in a planar contact state, whereby the reliability of the electrical connection is greatly improved.

In the above described electronic component, the plurality of electrodes provided on the lower case substrate may have electrode portions provided on a side surface of the lower case substrate, the electrode portions provided on the side surface protruding on the upper side of the lower case substrate.

By the above structure, it is possible to present the conductive joint material arranged on the upper surface of the lower case substrate from flowing out. At the same time, in the case of a structure in which the lower case substrate and the electronic component element are electrically connected to each other via a conductive joint material, it is possible to reliably form a fillet of the conductive joint material, whereby the reliability in connection via the conductive joint material is greatly enhanced.

Further, due to the flowing out of the conductive joint material, it is possible to prevent the conductive joint material from adhering to the surface of the external electrode on the side surface of the lower case substrate, and there is no concern that the solder wettability of the side electrode will be deteriorated.

In addition, due to the provision of the protrusion, the film thickness of the external electrode portion positioned in the edge portion of the lower case substrate increases, whereby the reliability of the external electrode in the edge portion is greatly improved.

In the above described electronic component, there may be at least three joint sections at which the electronic component element is joined with the lower case substrate via the conductive joint material. By arranging the external electrodes such that they extend to the lower case substrate, the electronic component element can be easily positioned with respect to the lower case substrate due to a self-alignment effect utilizing the conductive joint material. At the same time, it is possible to form the fillet of the conductive joint material reliably and uniformly, whereby an improvement in reliability of connection is achieved.

In the above described electronic component, all the leading electrodes of the electronic component element may be arranged on the surface on the lower case substrate side of the electronic component element.

By the above structure, the electronic component element can be easily electrically connected to the lower case substrate.

In the above described electronic component, it is preferred that the relationships $a_2 \geq a_0$ and $b_2 \geq b_0$ are satisfied where the length of the shorter sides of the upper case substrate is $a_2$ and the length of the longer sides thereof is $b_2$.

By the above structure, when securing the upper case substrate to the electronic component element, the positioning and alignment can be easily performed, whereby the assembly process is further simplified, and it is possible to prevent the occurrence of cracks, chips, and other defects to the electronic component element.

Further, there may be provided, in accordance with preferred embodiments of the present invention, an electronic component wherein a piezoelectric element may be used as the electronic component element. However, the electronic component of the present invention may comprise electronic component elements other than a piezoelectric element, for example, a capacitor or a resistor.

Other features and advantages of the present invention will become apparent from the following description of preferred embodiments of the invention which refers to the accompanying drawings.

DETAILED DESCRIPTION OF PREFERRED EMBODIMENTS

Figure 1:
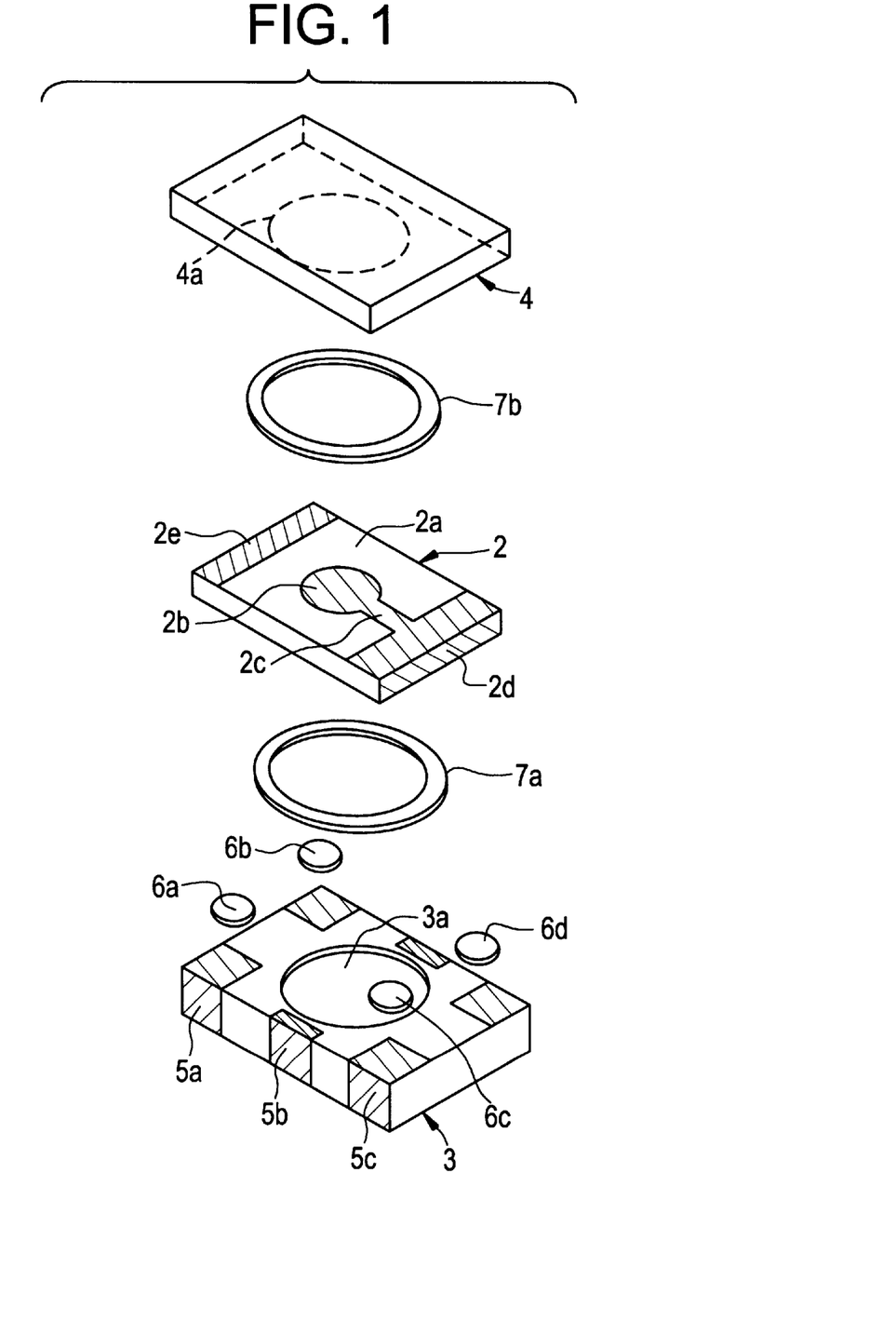
FIG. 1 is an exploded perspective view of a piezoelectric resonance device according to a preferred embodiment of the present invention.
Figure 2:
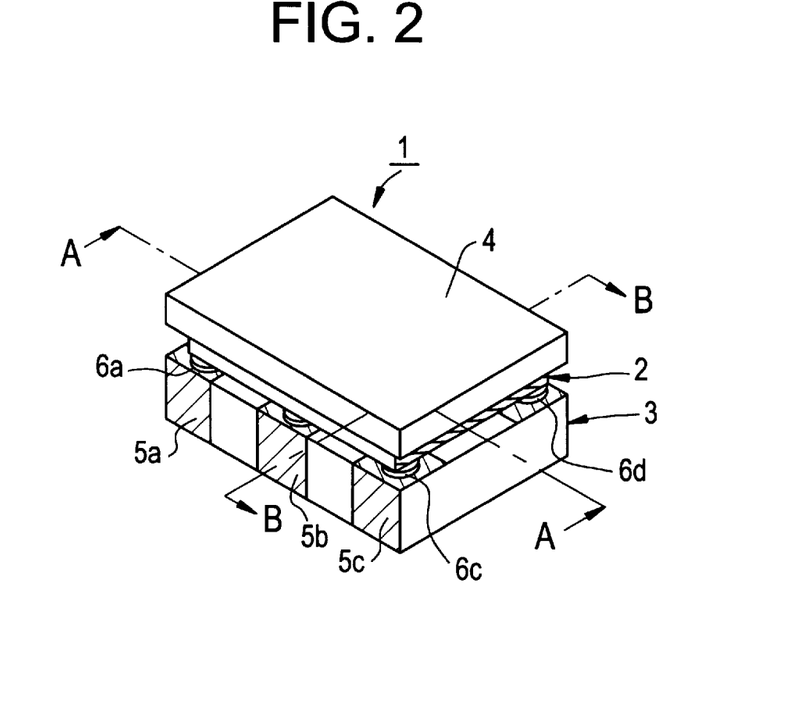
FIG. 2 is a perspective view showing the outward appearance of the piezoelectric resonance device of the preferred embodiment shown in FIG. 1.

FIG. 1 is an exploded perspective view of a surface mounting type piezoelectric resonance device according to a preferred embodiment of the present invention and FIG. 2 is a perspective view showing the outward appearance thereof.

In a piezoelectric resonance device 1, a piezoelectric resonance element 2 preferably including a substantially rectangular plate is sandwiched between and joined to substantially rectangular lower and upper case substrates 3 and 4.

The piezoelectric resonance element 2 includes a piezoelectric single crystal or piezoelectric ceramic. A resonance electrode 2b is provided at the approximate center of the upper surface of a piezoelectric substrate that has been polarized in the thickness direction, and another resonance electrode (not shown) is provided at the approximate center of the lower surface of the piezoelectric substrate so as to be opposite to the resonance electrode 2b. The resonance electrode 2b extends to the end surfaces through a conductive connection portion 2c, which is connected to a terminal electrode 2d. The terminal electrode 2d, which is arranged so as to cover one end surface of the piezoelectric substrate 2a, also extends up to the upper and lower surfaces of the substrate 2a. Similarly, the resonance electrode on the lower side is connected to a terminal electrode 2e through a conductive connection portion provided on the lower surface. The terminal electrode 2e, which is arranged so as to cover that end surface of the piezoelectric substrate 2a which is opposite to the terminal electrode 2c, also extends up to the upper and lower surfaces of the piezoelectric substrate 2.

Thus, the terminal electrodes 2d and 2e, which function as all of the leading electrodes for electrically connecting the piezoelectric resonance element 2 to the exterior, extend to the lower side of the piezoelectric substrate 2a.

By applying an AC voltage between the terminal electrodes 2d and 2e, the piezoelectric resonance element 2 vibrates in a thickness longitudinal oscillation mode.

The lower case substrate 3 is preferably formed of an insulating ceramic such as alumina or an insulating material such as synthetic resin. External electrodes 5a through 5c are disposed on the lower case substrate 3 such that the electrodes 5a–5c extend from the lower surface to the upper surface by way of the side surfaces of the substrate 2. The external electrodes 5a through 5c are arranged in order to enable the piezoelectric resonance device 1 of this preferred embodiment to be surface-mounted on a printed circuit board or the like.

Further, a recess 3a is formed on the upper side of the case substrate 3. The recess 3a is provided for reliably defining a space for allowing free and unhindered vibration of the piezoelectric resonance element 2 after assembly.

Like the lower case substrate 3, the upper case substrate 4 is preferably formed of an insulating ceramic such as alumina or synthetic resin. On the lower side of the upper case substrate 4, a recess 4a is formed for reliably defining a space for allowing free and unhindered vibration of the piezoelectric resonance element 2 after assembly.

This preferred embodiment is characterized in that relationships $a_0<a_1$ and $b_0<b_1$ and, further, $a_0<a_2$ and $b_0<b_2$ are satisfied; where $a_0$ is the length of the shorter sides of the piezoelectric resonance element 2, $b_0$ is the length of the longer sides of the piezoelectric resonance element 2, $a_1$ is the length of the shorter sides of the lower case substrate 3, $b_1$ is the length of the longer sides of the lower case substrate 3, $a_2$ is the length of the shorter sides of the upper case substrate 4, and $b_2$ is the length of the longer sides of the upper case substrate 4.

In the piezoelectric resonance device of this preferred embodiment, the piezoelectric resonance element 2, the lower case substrate 3 and the upper case substrate 4 have the above specific dimensional relationship, so that positioning of these elements during assembly is easy to perform. This will be clarified in the description of the assembly process.

When assembling the piezoelectric resonance device 1, the piezoelectric resonance element 2 is joined to the lower case substrate 3 via conductive joining materials 6a through 6d and a ring-like adhesive 7a. The piezoelectric resonance element 2 and the upper case substrate 3 are joined together via a ring-like adhesive 7b.

The conductive joining materials 6a through 6d may include an appropriate conductive joining material, such as a conductive adhesive or solder. The conductive joining materials 6a and 6b electrically connect the external electrode 5a and the terminal electrode 2e to each other, and the conductive joining materials 6c and 6d electrically connect the external electrode 5c and the terminal electrode 2d to each other and, at the same time, fasten the piezoelectric resonance element 2 to the lower case substrate 3.

The ring-like adhesive 7a preferably includes an insulating adhesive, and joins that portion of the lower case substrate 3 which surrounds the recess 3a to the piezoelectric resonance element 2. Similarly, the ring-like adhesive 7b joins that portion of the upper case substrate 4 which surrounds the recess 4a to the piezoelectric resonance element 2.

The ring-like adhesives 7a and 7b may include an appropriate insulating adhesive, for example, an epoxy type adhesive or a silicone type adhesive.

When performing the above assembly, the positioning of the piezoelectric resonance element 2 with respect to the lower case substrate 3 can be easily effected since the size of the piezoelectric resonance element 2 in plan view is smaller than the size of the lower case substrate 3 in plan view. That is, even if the position of the piezoelectric resonance element 2 is somewhat deviated within the range of the upper surface of the lower case substrate 3, the piezoelectric resonance substrate 2 does not outwardly protrude from the lower case substrate 3 and the upper case substrate 4, which are stacked together. Thus, cracks, breakage and the like are not generated when the piezoelectric resonance element 2 is handled. Thus, the piezoelectric resonance element 2 can be easily and accurately positioned with respect to the lower case substrate 3 and secured thereto.

Similarly, in this preferred embodiment, the size of the upper case substrate 4 in plan view is also larger than that of the piezoelectric resonance element 2, so that the upper case substrate 4 is also easily positioned with respect to the piezoelectric resonance element 2.

More specifically, in one example, the tolerance in positionally deviation is about 0.2 mm both in the longer side and shorter side directions when $a_0$=2.3 mm and $b_0$=2.8 mm in the piezoelectric resonance element 2, $a_1$=2.5 mm and $b_1$=3.0 mm in the lower case substrate 3, and $a_2$=2.5 mm and $b_2$=3.0 mm in the upper case substrate 4. Thus, the assembly of the piezoelectric resonance element 2, the lower case substrate 3 and the upper case substrate 4 is effected within the above tolerance range of positionally deviation, whereby the accuracy in positioning that is required is greatly decreased, and the piezoelectric resonance device 1 can be easily assembled.

Further, in the conventional piezoelectric resonance device shown in FIG. 11, the connection between the resonance electrode of the piezoelectric resonance element and the external electrode is effected in a linear contact state, so that a satisfactory level of reliability in connection cannot be achieved.

Figure 3:
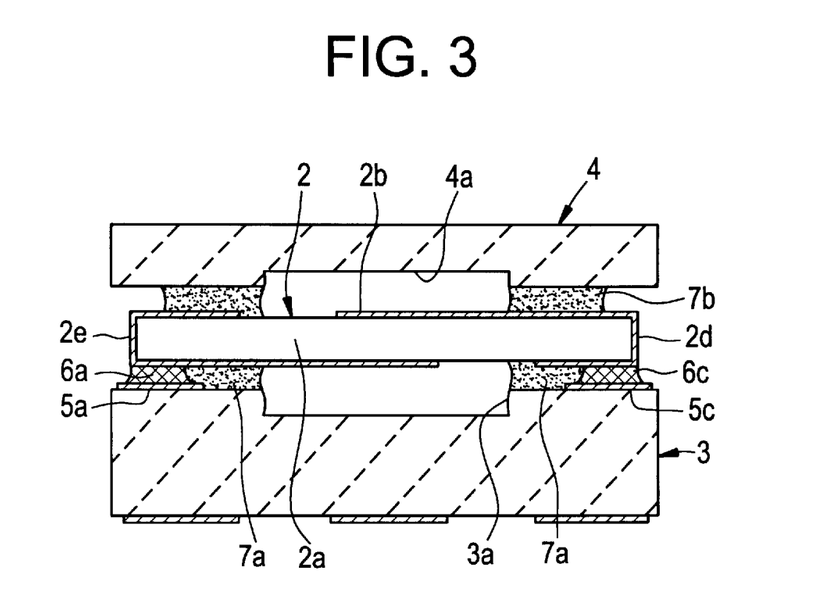
FIG. 3 is a sectional view taken along the line A—A of FIG. 2.

In contrast, in the preferred embodiment of the present invention, the terminal electrodes 2e and 2d are respectively joined to the external electrodes 5a and 5c via the conductive joining materials 6a and 6c, as is apparent from FIG. 3, which is a sectional view taken along the line A—A of FIG. 2. In these joining portions, the conductive joining materials 6a and 6c are in planar contact with the electrode on either side. Thus, an improvement is achieved in terms of reliability of electrical connection.

Figure 4:
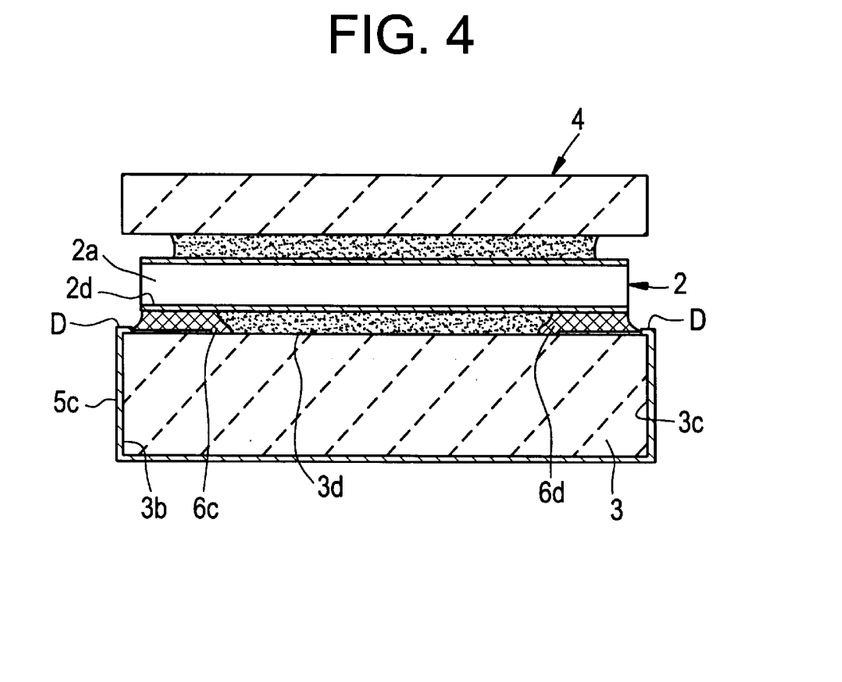
FIG. 4 is a sectional view taken along the line B—B of FIG. 2.
Figure 5:
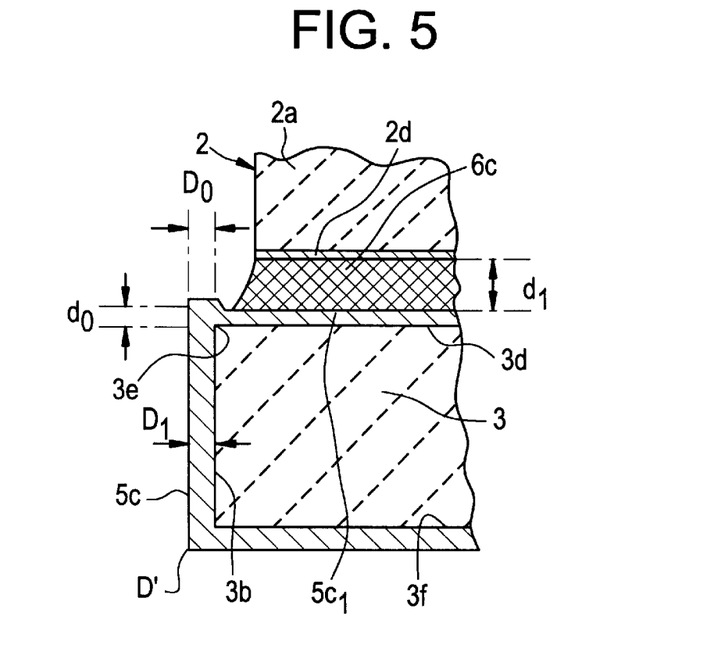
FIG. 5 is a partially cutaway enlarged sectional view of the main part of FIG. 4, illustrating a protrusion formed on an external electrode.

Preferably, as shown in FIG. 4, which is a sectional view taken along the line B—B of FIG. 2, regarding the external electrode 5c, the electrode portions disposed on the side surfaces 3b and 3c of the lower case substrate 3 protrude upwardly, that is, on the piezoelectric resonance element 2 side to form protrusions D. As shown in FIG. 5, which is an enlarged view, the protrusions D protrude upwardly from either end of the portions of the external electrode 5c disposed on the side surfaces 3b and 3c of the lower case substrate 3, and protrude beyond the portion $5c_1$ of the electrode 5c positioned on the upper surface 3d of the lower case substrate 3.

Further, assuming that the width of the protrusion D, that is, the dimension of the protrusion D as measured from the outer side surface to the end portion on the piezoelectric resonance element 2 side is $D_0$, and that the thickness of the portion of the external electrode 4c positioned on the side surface 3a is $D_1$, a relationship $D_0 > D_1$ is satisfied and the height $d_0$ of the protrusion D is such that, assuming that the thickness of the conductive joining material 6c is $d_1$, a relationship $d_1 > d_0 > d_1/30$ is satisfied.

By forming a protrusion D on the external electrode 5c as described above, it is possible to prevent the conductive joining material 6c from flowing out toward the side of the surface 3b, whereby a fillet-like shape is reliably provided in the conductive joint material 6c, thereby improving reliability of the connection via the conductive joining material 6c.

Further, by preventing the conductive joint material 6c from flowing out toward the side of the side surface 3b, it is possible to secure solderability via the external electrode 5c when an external electrode 5c having an excellent solder wettability is used.

Further, due to the formation of the protrusion D, the reliability of the external electrode 5c in the edge portion 3e of the lower case substrate 3 is also improved. That is, when no protrusion D is provided, separation, missing portions or other defects in the external electrode 5c are liable to be generated in the edge portion 3e. In contrast, by providing the protrusion D, the thickness of the external electrode on the edge portion 3e is increased, whereby such a problem can be avoided.

As shown in FIG. 5, it is also possible to form a downwardly protruding protrusion D' at the edge portion of the side surface 3b and the lower surface 3f of the lower case substrate 3.

While in the above description, the protrusion D is disposed on the external electrode 5c, similar protrusions D are also disposed on the other external electrodes 5a and 5b, providing the same effect as described above.

Figure 6A:
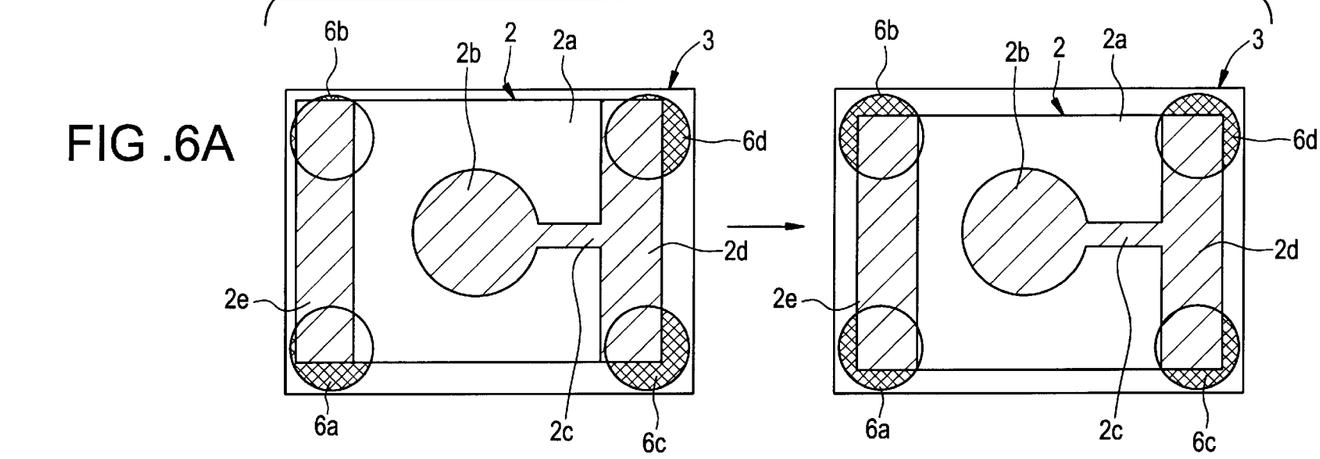
FIGS. 6(a) and 6(b) are a plan view and a side view illustrating a self-alignment effect due to a conductive adhesive.

Further, in the piezoelectric resonance device 1 of this preferred embodiment, the piezoelectric resonance element 2 is electrically connected to the lower case substrate 3 via the conductive joining materials 6a through 6d, that is, at four positions. Thus, as shown in FIGS. 6(a) and 6(b), by arranging the conductive joining materials 6a through 6d on the lower case substrate 3, melting the conductive joint materials 6a through 6d, and arranging the piezoelectric resonance element 2, it is possible to reliably position the piezoelectric resonance element 2 with respect to the lower case substrate 3 due to a self alignment effect.

That is, in the lower case substrate 3, by solely arranging the conductive joining materials 6a through 6d on those portions of the external electrodes 5a and 5b positioned on the upper surface of the lower case substrate 3, the terminal electrodes 2d and 2e of the piezoelectric resonance element 2 are reliably brought into contact with the conductive joint materials 6a, 6b or 6c, 6d because of the conductive joint materials 6a through 6d being in the molten state and, due to the surface tension of the conductive joint materials 6a through 6d, the piezoelectric resonance element 2 is secured after being positioned.

Figure 6B:
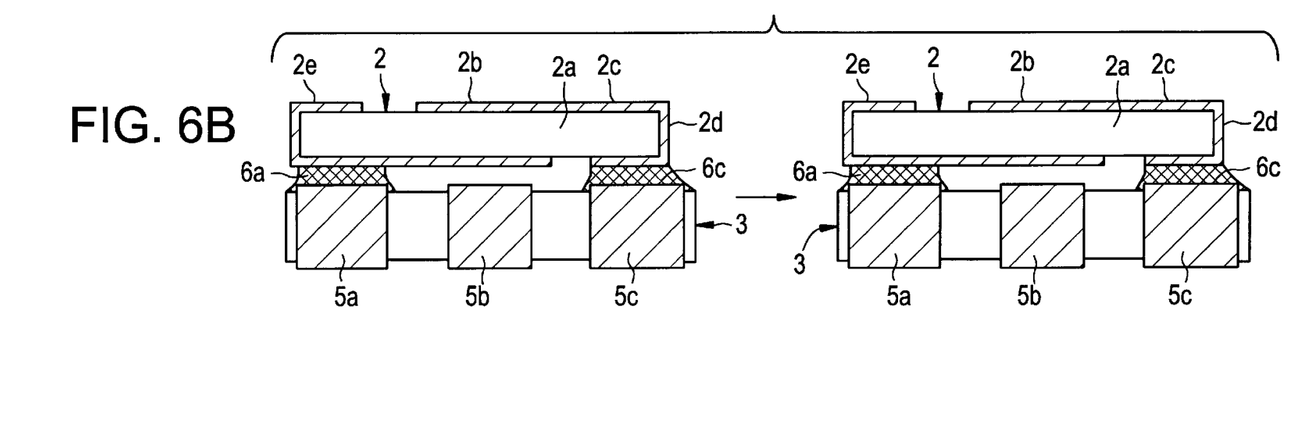

As a result, when the conductive joining materials 6a through 6d solidify, they assume a fillet-like shape and, as shown in FIG. 6(b), the reliability of the connection between the piezoelectric resonance element 2 and the external electrodes 5a and 5b is further improved by the fillet-shaped conductive joining materials 6a through 6d.

While in the above-described preferred embodiment, the piezoelectric resonance element 2 is electrically connected to the lower case substrate 3 via the conductive joining materials 6a through 6d, the electrical connection may be achieved by some other means.

Figure 7:
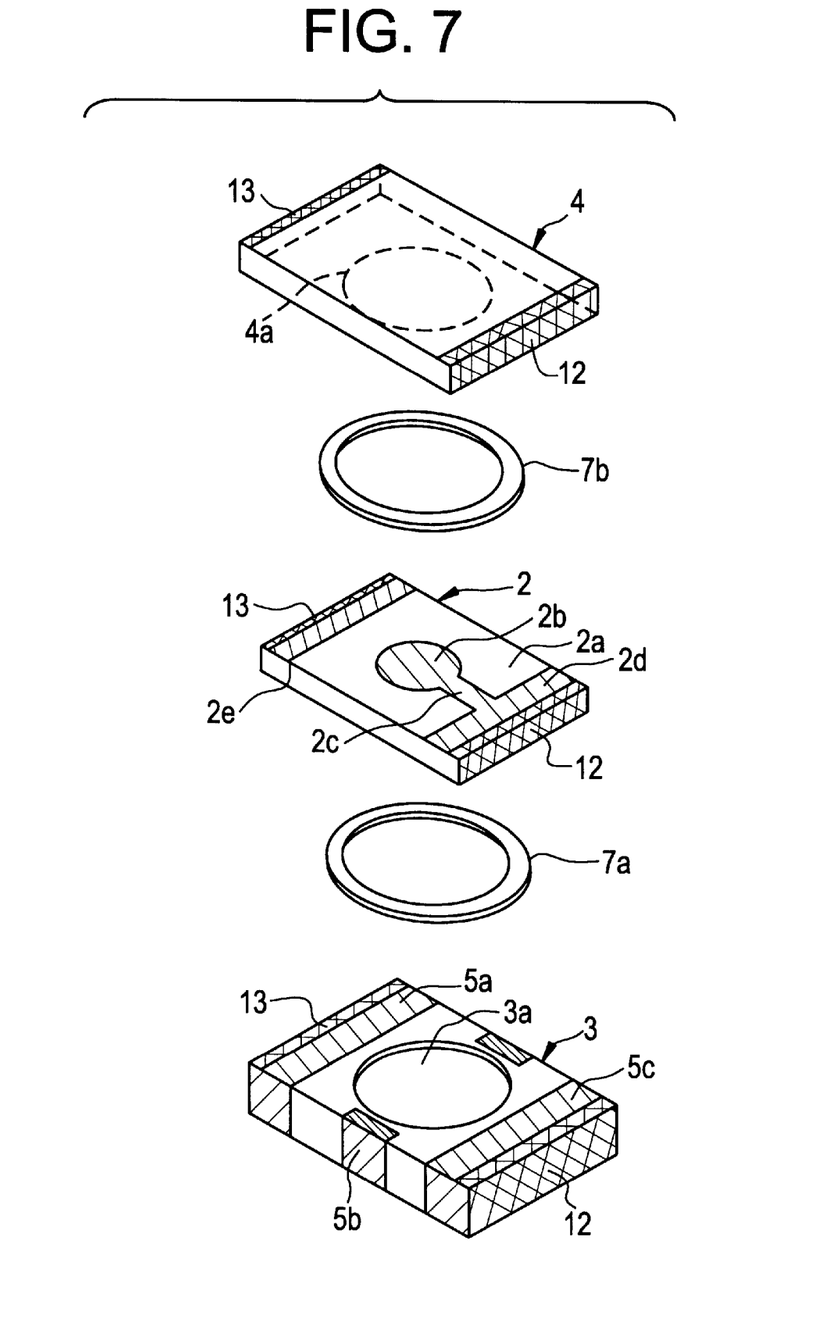
FIG. 7 is an exploded perspective view illustrating a modification of the piezoelectric resonance device of the preferred embodiment shown in FIG. 1.
Figure 8:
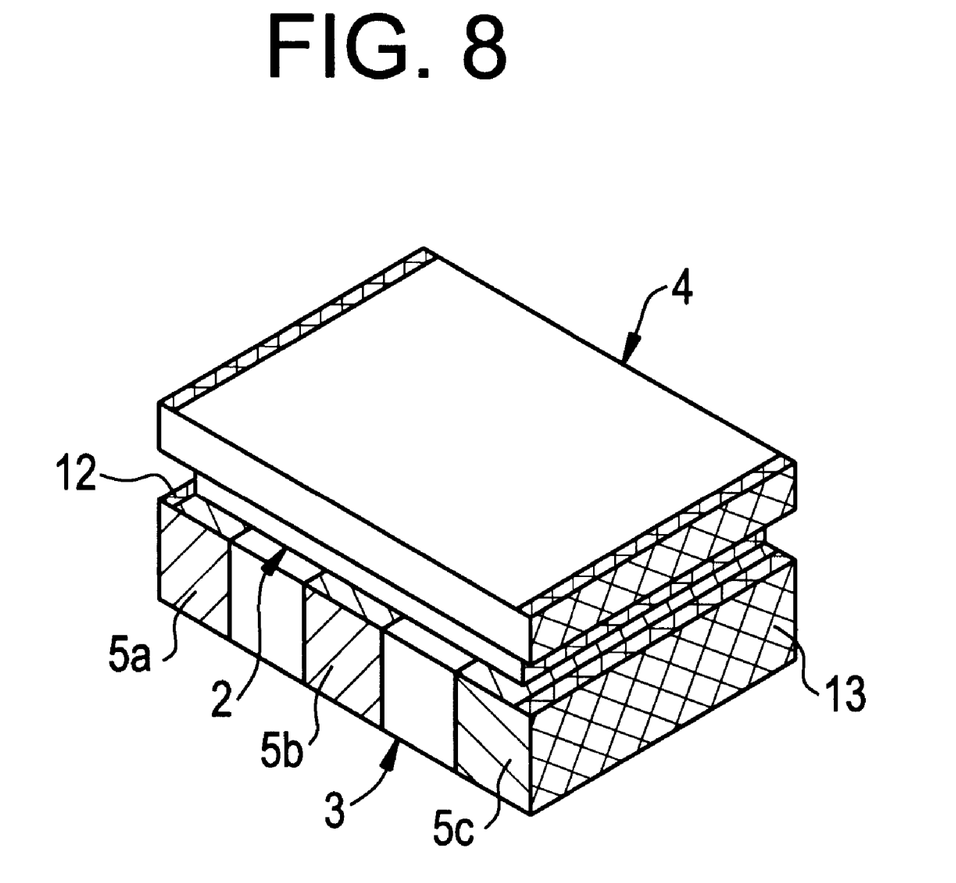
FIG. 8 is a perspective view showing the outward appearance of the modification shown in FIG. 7.

For example, in a piezoelectric resonance device 11 shown in FIGS. 7 and 8, the connection between the terminal electrode 2e of the piezoelectric resonance element 2 and the external electrode 5a of the lower case substrate 3 and the electrical connection between the terminal electrode 2d and the external electrode 5c are achieved in conductive layers 12 and 13 formed by a thin-film forming process such as evaporation or sputtering, without using the conductive joining materials 6a through 6d.

That is, as shown in FIG. 8, in the piezoelectric resonance device 11, conductive layers 12 and 13 are formed on the end surfaces thereof. FIG. 7 is an exploded perspective view (not showing the condition before assembly) of the piezoelectric resonance device 11. Conductive thin layers 12 and 13 are attached to the end surfaces of the upper case substrate 4, the end surfaces of the piezoelectric resonance element 2, and the end surfaces of the lower case substrate 3. Since a thin-film forming method such as evaporation or sputtering is used, the conductive layers 12 and 13 are formed so as to cover not only the end surfaces but also part of the upper and lower surfaces of each member.

When performing the assembly, the piezoelectric resonance element 2, and the lower case substrate 3 and the upper case substrate 4 are joined together via the ring-like adhesives 6 and 7, without forming the conductive layers 12 and 13. The conductive layers 12 and 13 are formed by a thin-film forming method on the end surfaces of these members 2, 3, 4 thus stacked together. That is, the electrical connection between the piezoelectric resonance element 2 and the lower case 3 may be effected by forming the conductive layers 12 and 13 via a thin-film forming method after the assembly.

In the piezoelectric resonance device 11, the dimensional relationship between the piezoelectric resonance element 2, the lower case substrate 3 and the upper case substrate 4 is preferably the same as that in the case of the piezoelectric resonance device 1 of the above-described preferred embodiment. Thus, as in the above described preferred embodiment, the piezoelectric resonance element can be easily positioned with respect to the lower case substrate 3. In addition, the lower case substrate can be easily positioned with respect to the upper case substrate 4.

Figure 9:
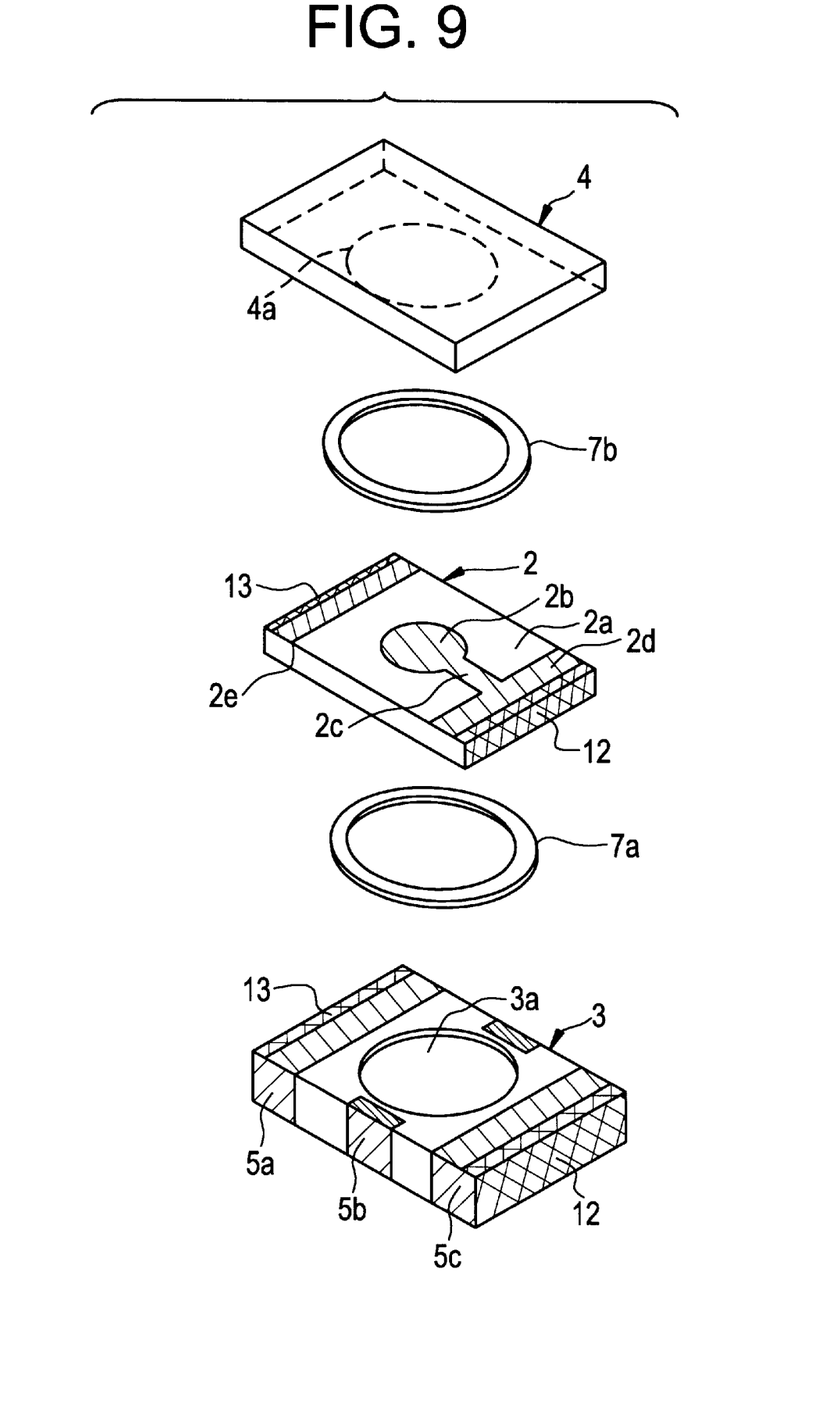
FIG. 9 is an exploded perspective view illustrating another modification of the piezoelectric resonance device of the preferred embodiment shown in FIG. 1.
Figure 10:
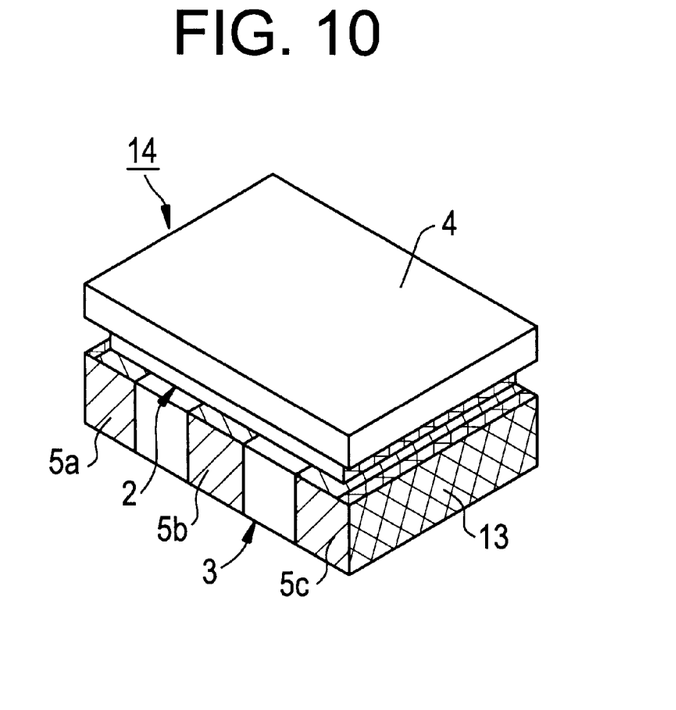
FIG. 10 is a perspective view showing the outward appearance of the piezoelectric resonance device of the modification shown in FIG. 9.

Further, as shown in FIGS. 9 and 10, when forming the conductive layers 12 and 13 via evaporation or sputtering, the conductive layers 12 and 13 may be formed so as not to be attached to the upper case substrate 4. That is, in the piezoelectric resonance device 14 shown in FIG. 10, the conductive layers 12 and 13 are disposed on the end surfaces of the lower case substrate 4 and the end surfaces of the piezoelectric resonance element 2, but are not disposed on the upper case substrate 4, as shown in FIG. 9, which is an exploded perspective view. Since the upper case substrate 4 requires no electrical connection, there is no need to form conductive layers 12 and 13 thereon.

The conductive layers 12 and 13 can be formed by a thin-film forming method such as evaporation, sputtering or plating, using an appropriate conductive material, such as Ag, Ag—Pd or Cu.

Further, while in the above-described piezoelectric resonance devices 1, 11 and 14 no special use is made of the external electrode 5b, it is also possible to form the lower case substrate 3 of a dielectric material and incorporate a capacitor by utilizing the external electrode 5b to thereby form a load capacitance containing type piezoelectric oscillator.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic component comprising:
an electronic component element including a substantially rectangular plate having terminal electrodes provided on at least two sides edges of said electronic component element;
upper and lower case substrates each including substantially rectangular plates stacked on each other with the electronic component element disposed therebetween, such that said terminal electrodes of said electronic component element are exposed to the exterior of the electronic component at said at least two side edges; and
an adhesive arranged to directly adhere the upper and lower case substrates to the electronic component element;
wherein $a_0<a_1$ and $b_0<b_1$ are satisfied where a length of shorter sides and a length of longer sides of the electronic component element are $a_0$ and $b_0$, respectively, and a length of shorter sides and a length of longer sides o the lower case substrate are $a_1$ and $b_1$, respectively.

2. The electronic component according to claim 1, wherein a plurality of electrodes are provided on the lower case substrate, the electronic component element being electrically connected to the electrodes of the lower case substrate via a conductive joining material.

3. The electronic component according to claim 2, wherein the plurality of electrodes provided on the lower case substrate have electrode portions provided on a side surface of the lower case substrate and extending to an upper surface of the lower case substrate.

4. The electronic component according to claim 2, wherein there are at least three joint sections at which the electronic component element is joined with the lower case substrate via the conductive joining material.

5. The electronic component according to claim 1, wherein the electronic component element includes a plurality of lead electrodes arranged such that each of the plurality of lead electrodes includes a portion disposed on a surface of the electronic component element which faces the lower case substrate.

6. The electronic component according to claim 1, wherein $a_2>a_0$ and $b_2>b_0$ are satisfied where a length of the shorter sides of the upper case substrate is $a_2$ and a length of the longer sides of the upper case substrate is $b_2$.

7. The electronic component according to claim 1, wherein the electronic component element is a piezoelectric element.

8. The electronic component according to claim 7, wherein the piezoelectric element vibrates in a thickness longitudinal extension oscillation mode.

9. The electronic component according to claim 1, wherein the electronic component is a surface mount device.

10. The electronic component according to claim 1, wherein each of the upper and lower case substrates includes a recess formed therein to allow for unhindered vibration of the electronic component element.

11. The electronic component according to claim 1, wherein a ring adhesive member is arranged to surround each of the recesses and to join the upper and lower case substrates to the electronic component element.

12. The electronic component according to claim 3, wherein the electrode portions on the side surfaces of the lower case substrate protrude upwardly to define protrusions.

13. The electronic component according to claim 12, wherein the protrusions are located at opposite end portions of the lower case substrate.

14. The electronic component according to claim 12, wherein a relationship $D_0>D_1$ is satisfied where $D_0$ is a dimension of each of the protrusions measured from an outer side surface to an end portion of the respective electrode portion and $D_1$ is a thickness of the electrode portion on the side of the lower case substrate.

15. The electronic component according to claim 12, wherein a relationship $d_1>d_0>d_1/30$ is satisfied where $d_1$ is a thickness of a conductive joining material joining the electronic component element to the lower case substrate and $d_0$ is a height of each of the protrusions.

16. An electronic component comprising:

an electronic component element having terminal electrodes provided on at least two sides edges of said electronic component element;

upper and lower case substrates stacked on each other with the electronic component element disposed therebetween, such that said terminal electrodes of said electronic component element are exposed to the exterior of the electronic component at said at least two side edges; and an adhesive arranged to directly adhere the upper and lower case substrates to the electronic component element; wherein a size of the electronic component element is smaller than a size of at least one of the upper and lower case substrates.

17. The electronic component according to claim 16, wherein a size of the electronic component element is smaller than a size of each of the upper and lower case substrates.

18. The electronic component according to claim 16, wherein a length and a width of the electronic component element are smaller than a length and a width, respectively, of the lower case substrate.

19. The electronic component according to claim 16, wherein a length and a width of the electronic component are smaller than a length and a width, respectively, of the upper case substrate.

* * * * *